United States Patent
Endo et al.

(10) Patent No.: US 7,737,438 B2
(45) Date of Patent: *Jun. 15, 2010

(54) FIELD-EFFECT TRANSISTOR AND METHOD FOR MANUFACTURING THE SAME

(75) Inventors: Ayanori Endo, Ebina (JP); Ryo Hayashi, Yokohama (JP); Tatsuya Iwasaki, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/167,540

(22) Filed: Jul. 3, 2008

(65) Prior Publication Data

US 2008/0272370 A1 Nov. 6, 2008

Related U.S. Application Data

(62) Division of application No. 11/851,764, filed on Sep. 7, 2007, now Pat. No. 7,411,209.

(30) Foreign Application Priority Data

Sep. 15, 2006 (JP) ............................. 2006-250902

(51) Int. Cl.
*H01L 29/12* (2006.01)
(52) U.S. Cl. .................. 257/43; 257/66; 257/E21.413; 438/158; 438/161
(58) Field of Classification Search .............. 257/43, 257/66, E21.413; 438/151, 158, 161
See application file for complete search history.

(56) References Cited

U.S. PATENT DOCUMENTS

| | | | |
|---|---|---|---|
| 5,593,335 A | 1/1997 | Suzuki et al. .................. 445/50 |
| 5,693,959 A | 12/1997 | Inoue et al. .................... 257/66 |
| 6,132,817 A | 10/2000 | Tokutake et al. ............ 427/578 |
| 6,160,347 A | 12/2000 | Iwasaki et al. ............... 313/545 |
| 6,231,412 B1 | 5/2001 | Kawade et al. .................. 445/3 |
| 6,283,815 B1 | 9/2001 | Iwasaki et al. ................. 445/41 |
| 6,936,854 B2 | 8/2005 | Iwasaki et al. ................. 257/81 |
| 7,411,209 B2 * | 8/2008 | Endo et al. ..................... 257/43 |
| 2004/0262606 A1 | 12/2004 | Teramoto ...................... 257/59 |
| 2008/0038882 A1 | 2/2008 | Takechi et al. ............... 438/151 |

FOREIGN PATENT DOCUMENTS

JP 2002-076356 3/2002

(Continued)

OTHER PUBLICATIONS

K. Nomura et al., "Room-temperature fabrication of transparent flexible thin-film transistors using amorphous oxide semiconductors" Nature 432, Nov. 2004, pp. 488-492.

*Primary Examiner*—Wael Fahmy
*Assistant Examiner*—John C Ingham
(74) *Attorney, Agent, or Firm*—Fitzpatrick, Cella, Harper & Scinto

(57) ABSTRACT

A method for manufacturing a field-effect transistor includes the steps of forming a source electrode and a drain electrode each containing hydrogen or deuterium; forming an oxide semiconductor layer in which the electrical resistance is decreased if hydrogen or deuterium is added; and, causing hydrogen or deuterium to diffuse from the source electrode and the drain electrode to the oxide semiconductor layer.

14 Claims, 9 Drawing Sheets

FOREIGN PATENT DOCUMENTS

| | | |
|---|---|---|
| JP | 2007-220816 A | 8/2007 |
| JP | 2007-220817 A | 8/2007 |
| JP | 2007-220819 A | 8/2007 |
| JP | 2008-042088 A | 2/2008 |
| WO | WO 2007/119386 A1 | 10/2007 |

\* cited by examiner

FIELD-EFFECT TRANSISTOR AND METHOD FOR MANUFACTURING THE SAME

RELATED APPLICATIONS

This application is a division of co-pending application Ser. No. 11/851,764, filed Sep. 7, 2007, which is incorporated by reference herein in its entirety, as if fully set forth herein, and claims the benefit of priority under 35 U.S.C. §119, based on Japanese Priority Application No. 2006-250902, filed Sep. 15, 2006, which is incorporated by reference herein in its entirety, as if fully set forth herein.

BACKGROUND OF THE INVENTION

1. Field of the Invention

The present invention relates to a field-effect transistor having an oxide film as a semiconductor layer, a method for manufacturing the field-effect transistor, and a display apparatus.

2. Description of the Related Art

In recent years, thin film transistors (TFTs) including a channel layer of a polycrystalline transparent conductive ZnO-based oxide thin film have actively been developed (see Japanese Patent Laid-Open No. 2002-76356).

Japanese Patent Laid-Open No. 2002-76356 stated that because the thin film can be formed at a low temperature and is transparent to visible light, a flexible transparent TFT can be formed on a substrate such as a plastic plate or a film.

However, a ZnO-based compound cannot form a stable amorphous phase at room temperature, but forms a polycrystalline phase. It is therefore difficult to increase electron mobility because of scattering at grain boundaries. Furthermore, the shape and the interconnection of polycrystalline grains vary widely with the film-forming method. This also produces variations in the characteristics of TFT devices.

Recently, a thin film transistor containing an In—Ga—Zn—O amorphous oxide has been reported (see K. Nomura et. al., Nature 432, 488 (2004)). This transistor can be formed on a plastic substrate or a glass substrate at room temperature. In addition, the transistor has a field-effect mobility approximately in the range of 6 to 9 $cm^2/Vs$ and normally-off characteristics. Furthermore, the transistor is transparent to visible light.

The present inventors studied TFTs containing oxides, including amorphous In—Ga—Zn—O, and found that the transistor characteristics of the TFTs sometimes varied, although the transistor characteristics depend on the composition and the manufacturing conditions of the TFTs.

The variations in transistor characteristics can cause variations in operation of organic light-emitting diodes (LEDs) and liquid crystals driven by the transistors, for example, in a pixel circuit of a display.

The variations may be caused by parasitic resistance generated between a source electrode and a channel and between a drain electrode and a channel.

SUMMARY OF THE INVENTION

Accordingly, the present invention provides a thin film transistor in which variations in transistor characteristics caused by parasitic resistance are reduced.

A method for manufacturing a field-effect transistor according to the present invention includes the steps of forming a source electrode and a drain electrode each containing hydrogen or deuterium, forming an oxide semiconductor layer, the electrical resistance of the oxide semiconductor layer being decreased if hydrogen or deuterium is added, and causing hydrogen or deuterium to diffuse from the source electrode and the drain electrode to the oxide semiconductor layer.

Furthermore, in a field-effect transistor including an oxide semiconductor layer according to the present invention, the electrical resistance of the oxide semiconductor layer is decreased if hydrogen or deuterium is added, and the concentration of hydrogen or deuterium in regions in the oxide semiconductor layer in contact with a source electrode and a drain electrode is higher than the average concentration of hydrogen or deuterium in the oxide semiconductor layer.

Furthermore, in a display apparatus including display devices according to the present invention, electrodes of each of the display devices are electrically connected to a source electrode or a drain electrode of a field-effect transistor according to the present invention.

A method for manufacturing a field-effect transistor according to the present invention allows hydrogen or deuterium contained in a source electrode and a drain electrode to diffuse into an oxide semiconductor layer. Also, the method reduces the resistance in regions in the oxide semiconductor layer in contact with the source electrode and the drain electrode. This reduces the parasitic resistance generated between the source electrode and the oxide semiconductor layer and between the drain electrode and the oxide semiconductor layer. Thus, a field-effect transistor according to the present invention can have excellent stability.

Further features of the present invention will become apparent from the following description of exemplary embodiments with reference to the attached drawings.

DESCRIPTION OF THE EMBODIMENTS

Figure 1A:
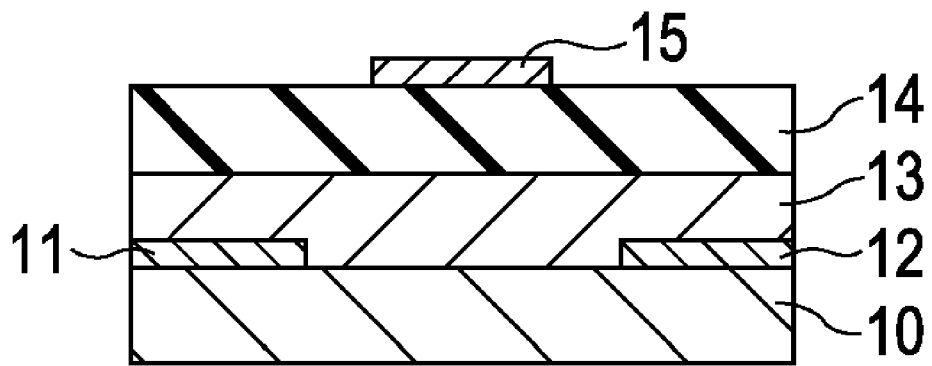
FIGS. 1A and 1B are cross-sectional views of a field-effect transistor according to an embodiment of the present invention.
Figure 1B:
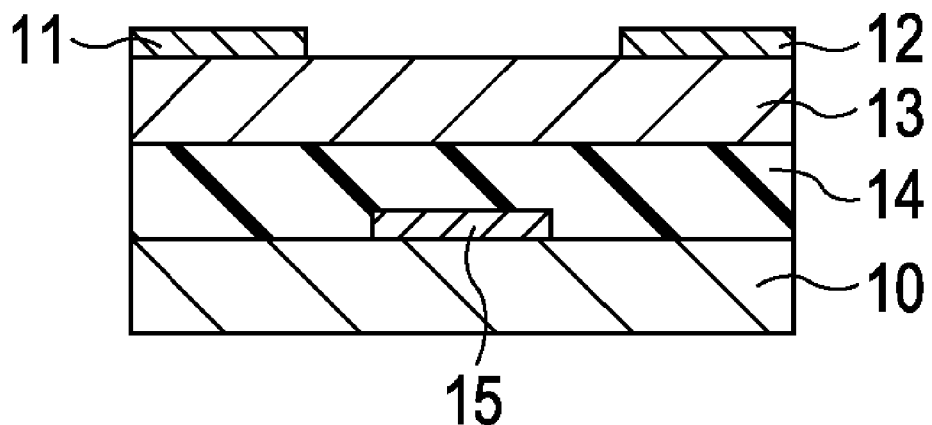

FIGS. 1A and 1B illustrate a top-gate structure and a bottom-gate structure of a field-effect transistor according to an embodiment of the present invention, respectively. FIGS. 2A to 2F illustrate a method for manufacturing a top-gate field-effect transistor.

Formation of Hydrogen-Containing Electrode

Figure 2A:
FIGS. 2A to 2F are schematic views illustrating a method for manufacturing a field-effect transistor according to an embodiment of the present invention.
Figure 2B:
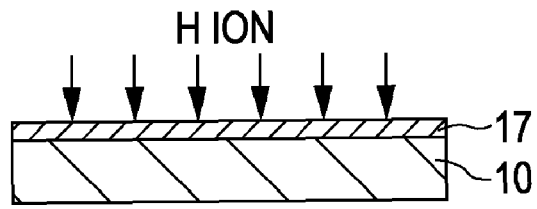

As illustrated in FIG. 2B, an electrode layer 17 is formed on a substrate 10 which is illustrated in FIG. 2A. A source electrode 11 and a drain electrode 12 are later formed from the electrode layer 17. The electrode layer 17 may be formed by sputtering, pulsed laser deposition (PLD), electron-beam evaporation, or chemical vapor deposition (CVD). The substrate 10 may be a glass plate, a plastic plate, or a plastic film.

The electrode layer 17 may be formed of any electrically conductive material. Examples of the electrically conductive material include oxide conductors, such as $In_2O_3$:Sn and ZnO, and metallic electrode materials such as Pt, Au, Ni, and Al.

After the formation of the electrode layer 17, hydrogen or deuterium may be implanted by accelerated hydrogen ion implantation (FIG. 2B).

Alternatively, hydrogen or deuterium may be implanted by forming the electrode layer 17 while introducing a hydrogen or deuterium gas or by treating the electrode layer 17 with hydrogen plasma.

In the ion implantation method, $H^+$ ions, $H^-$ ions, $D^+$ ions (deuterium ions), or $H_2^+$ ions (hydrogen-molecule ions) may be used. These ions may herein collectively be referred to as hydrogen ions. The term "hydrogen" used herein includes isotopes of hydrogen.

The hydrogen plasma processing may be performed with a parallel-plate plasma CVD apparatus or a reactive ion etching (RIE) type plasma etching apparatus.

Hydrogen or deuterium may be implanted into the source electrode 11 and the drain electrode 12 at a concentration in the range of $1 \times 10^{19}$ to $1 \times 10^{22}$ (/cm$^3$). The hydrogen concentration may be determined by secondary ion mass spectrometry (SIMS).

Figure 2C:

As illustrated in FIG. 2C, the source electrode 11 and the drain electrode 12 may be patterned by photolithography.

Hydrogen ions may be implanted before and/or after the patterning of the source electrode 11 and the drain electrode 12.

Oxide Semiconductor Layer

Figure 2D:
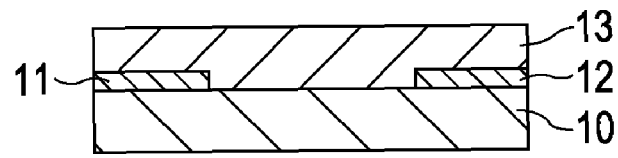

As illustrated in FIG. 2D, an oxide semiconductor layer 13 is formed on the substrate 10, the patterned source electrode 11, and the patterned drain electrode 12.

The oxide semiconductor layer 13 may be formed by sputtering, pulsed laser deposition (PLD), electron-beam evaporation, or chemical vapor deposition (CVD).

The oxide semiconductor layer 13 may be formed of any oxide semiconducting material, provided that the electrical resistance of the oxide semiconducting material is decreased by the addition of hydrogen or deuterium. Examples of the oxide semiconducting material include indium oxides and zinc oxides. The oxide semiconductor layer 13 can be formed of an amorphous oxide.

The oxide semiconductor layer 13 can be formed of an amorphous In—Ga—Zn oxide.

Figure 3:
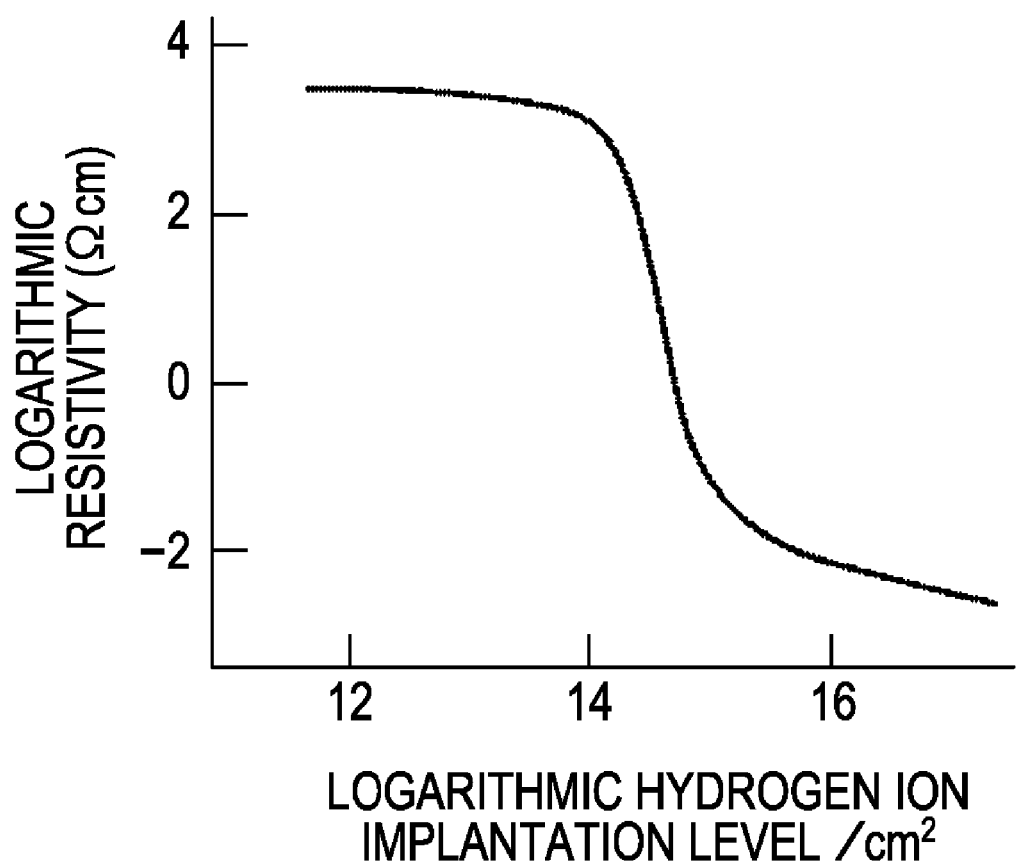
FIG. 3 is a graph illustrating the resistivity of an In—Ga—Zn—O amorphous oxide film as a function of hydrogen ion implantation level.

FIG. 3 illustrates the electrical conductivity of an InGaZnO$_4$ thin film having a thickness of about 500 nm as a function of hydrogen ion implantation level. The horizontal axis indicates the logarithmic hydrogen ion implantation level per unit area, and the vertical axis indicates the logarithmic resistivity. FIG. 3 shows that the hydrogen ion implantation in the amorphous oxide film can increase the electrical conductivity.

Gate Insulating Layer

Figure 2E:
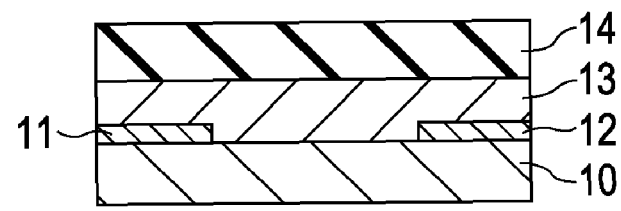

As illustrated in FIG. 2E, a gate insulating layer 14 is formed on the oxide semiconductor layer 13. The gate insulating layer 14 may be formed by sputtering, pulsed laser deposition (PLD), electron-beam evaporation, or chemical vapor deposition (CVD).

The gate insulating layer 14 may be formed of any insulating material. Examples of the insulating material include $Al_2O_3$, $Y_2O_3$, $HfO_2$, and mixed-crystal compounds composed of at least two of these compounds.

Gate Electrode

Figure 2F:
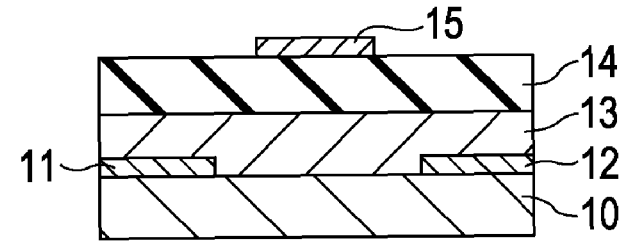

As illustrated in FIG. 2F, a gate electrode 15 is formed on the gate insulating layer 14. The gate electrode 15 may be formed by sputtering, pulsed laser deposition (PLD), electron-beam evaporation, or chemical vapor deposition (CVD).

The gate electrode 15 may be formed of any electrically conductive material. Examples of the electrically conductive material include oxide conductors, such as $In_2O_3$:Sn and ZnO, and metallic electrode materials such as Pt, Au, Ni, and Al.

The gate electrode 15 may be patterned by photolithography so as to achieve transistor characteristics, taking the positional relationship of the source electrode 11 and the drain electrode 12 into account.

Diffusion Treatment

Hydrogen or deuterium contained in the source electrode 11 and the drain electrode 12 is then caused to diffuse into the oxide semiconductor layer 13.

Hydrogen or deuterium is caused to diffuse such that the concentration of hydrogen or deuterium in regions in the oxide semiconductor layer 13 in contact with the source electrode 11 and the drain electrode 12 is higher than the average concentration of hydrogen or deuterium in the oxide semiconductor layer 13.

The concentration of hydrogen or deuterium in the regions in the oxide semiconductor layer 13 in contact with the source electrode 11 and the drain electrode 12, and the average concentration of hydrogen or deuterium in the oxide semiconductor layer 13, may be determined from the composition distribution of the oxide semiconductor layer 13 in the depth direction measured by SIMS.

The above-mentioned "regions in the oxide semiconductor layer 13 in contact with the source electrode 11 and the drain electrode 12" are boundary regions between the source electrode 11 and the oxide semiconductor layer 13 and between the drain electrode 12 and the oxide semiconductor layer 13. However, if the semiconducting properties are not adversely affected, hydrogen or deuterium may be caused to diffuse not only in regions in the oxide semiconductor layer 13 in contact with the source electrode 11 and the drain electrode 12, but also toward the gate insulating layer 14 opposing the source electrode 11 and the drain electrode 12.

Furthermore, the minimum amount of hydrogen or deuterium diffusing in the regions may be such that the parasitic resistance, generated between the source electrode 11 and the oxide semiconductor layer 13 and between the drain electrode 12 and the oxide semiconductor layer 13, is reduced. However, a greater amount of hydrogen or deuterium may be caused to diffuse if the semiconducting properties are not adversely affected.

Furthermore, hydrogen or deuterium can remain in the source electrode 11 and/or the drain electrode 12 within the bounds of not adversely affecting the electrical characteristics.

Diffusion of hydrogen or deuterium is performed by annealing, such as by heating with a lamp or by laser annealing. The degree of hydrogen or deuterium diffusion depends on the annealing temperature and annealing time.

Diffusion of hydrogen or deuterium may be performed at any time after the oxide semiconductor layer 13 is formed on the source electrode 11 and the drain electrode 12, each containing hydrogen or deuterium.

Alternatively, hydrogen or deuterium may be caused to diffuse into the oxide semiconductor layer 13 during the formation of the oxide semiconductor layer 13 while the substrate 10 is heated.

Furthermore, a larger amount of hydrogen or deuterium in the source electrode 11 and the drain electrode 12 can reduce the annealing temperature and even allows hydrogen or deuterium to diffuse into the oxide semiconductor layer 13 approximately at room temperature without annealing.

For a plastic substrate or a film substrate, it is recommended that hydrogen or deuterium in the substrate 11 and the oxide material film 12 be increased to reduce the annealing temperature.

The hydrogen-ion concentration of the regions in the oxide semiconductor layer 13 in contact with the source electrode 11 and the drain electrode 12 is in the range of 0.1 to 10 atomic percent and can be in the range of 0.5 to 5 atomic percent. In this regard, the electrical resistance of the oxide semiconductor layer 13 is not reduced sufficiently at a hydrogen-ion concentration below 0.1 atomic percent, but is excessively reduced at a hydrogen-ion concentration above 10 atomic percent.

Field-Effect Transistor

The field-effect transistors illustrated in FIGS. 1A and 1B include the substrate 10, the source electrode 11, the drain electrode 12, the oxide semiconductor layer 13, the gate insulating layer 14, and the gate electrode 15. The characteristics of each component are described above.

The phrase "the concentration of hydrogen or deuterium in the regions in the oxide semiconductor layer 13 in contact with the source electrode 11 and the drain electrode 12", as used herein, means the concentration of hydrogen or deuterium in the oxide semiconductor layer 13 in the vicinities of the source electrode 11 and the drain electrode 12.

The concentration of hydrogen or deuterium in the regions in the oxide semiconductor layer 13 in contact with the source electrode 11 and the drain electrode 12 is higher than the average concentration of hydrogen or deuterium in the oxide semiconductor layer 13. Thus, the higher concentration of hydrogen or deuterium in the regions in the oxide semiconductor layer 13 in contact with the source electrode 11 and the drain electrode 12 reduces the parasitic resistance.

The concentration of hydrogen or deuterium in the regions in the oxide semiconductor layer 13 in contact with the source electrode 11 and the drain electrode 12 and the average concentration of hydrogen or deuterium in the oxide semiconductor layer 13 may be determined from the composition distribution of the oxide semiconductor layer 13 in the depth direction measured by SIMS. The regions in the oxide semiconductor layer 13 in contact with the source electrode 11 and the drain electrode 12 are sufficient for the regions in which hydrogen or deuterium diffuses. However, if the semiconducting properties are not adversely affected, hydrogen or deuterium may be caused to diffuse toward the gate insulating layer 14 opposing the source electrode 11 and the drain electrode 12. Furthermore, the minimum amount of hydrogen or deuterium diffusing in the regions may be such that the parasitic resistance, generated between the source electrode 11 and the oxide semiconductor layer 13 and between the drain electrode 12 and the oxide semiconductor layer 13, is reduced. However, a greater amount of hydrogen or deuterium may be caused to diffuse if the semiconducting properties are not adversely affected.

Display Apparatus

A display apparatus can be assembled by coupling an output terminal, that is, a drain of the field-effect transistor to an electrode of a display device, such as an organic or inorganic electroluminescent (EL) device or a liquid crystal device. A display apparatus will be described in detail below with reference to a cross-sectional view of the display apparatus.

Figure 9:
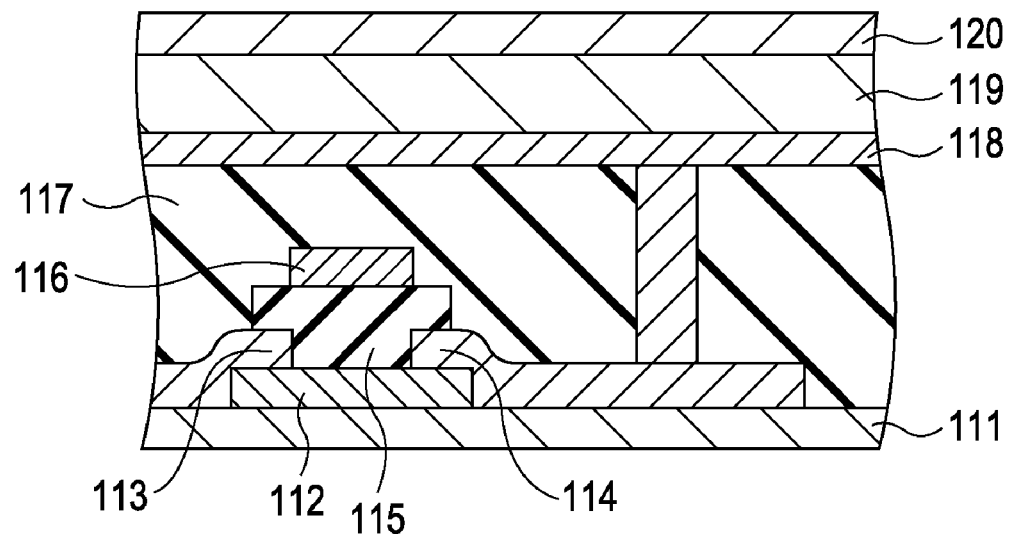
FIG. 9 is a cross-sectional view of a display apparatus according to an embodiment of the present invention.

As illustrated in FIG. 9, a field-effect transistor includes an oxide film (channel layer) 112, a source electrode 113, a drain electrode 114, a gate insulating film 115, and a gate electrode 116 disposed on a substrate 111. The drain electrode 114 is electrically connected to a first electrode 118 via an interlayer insulating film 117. The first electrode 118 is in contact with a luminescent layer 119, which is in contact with a second electrode 120. Thus, an electric current to be supplied to the luminescent layer 119 can be controlled by an electric current flowing through a channel of the oxide film 112 from the source electrode 113 to the drain electrode 114. The electric current to be supplied to the luminescent layer 119 can therefore be controlled by the voltage of the gate electrode 116 of the field-effect transistor. The first electrode 118, the luminescent layer 119, and the second electrode 120 constitute an inorganic or organic electroluminescent device.

Figure 10:
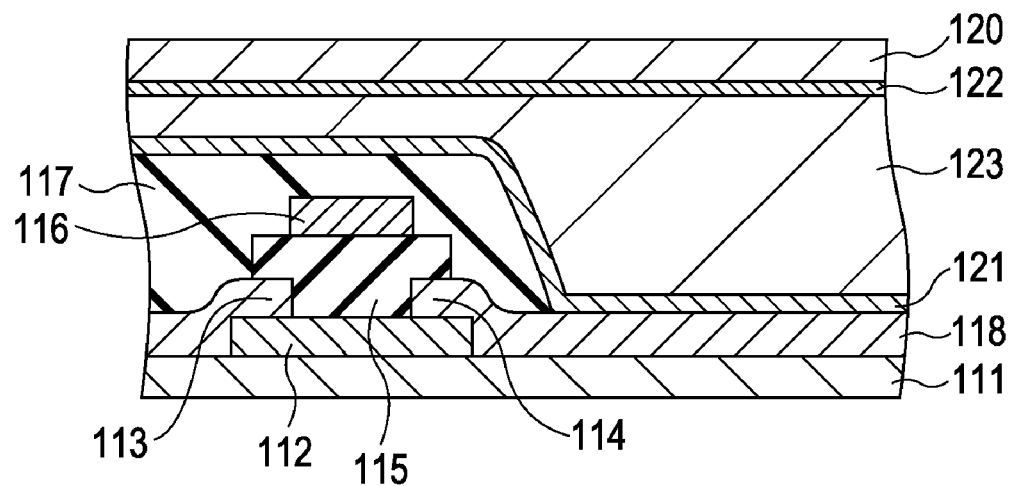
FIG. 10 is a cross-sectional view of a display apparatus according to another embodiment of the present invention.

Alternatively, as illustrated in FIG. 10, an extended drain electrode 114 also serves as a first electrode 118. A voltage is applied via the first electrode 118 to a liquid crystal cell or an electrophoretic particle cell 123 disposed between high-resistance films 121 and 122. The liquid crystal cell or the electrophoretic particle cell 123, the high-resistance films 121 and 122, the first electrode 118, and the second electrode 120 constitute a display device. A voltage to be applied to the display device can be controlled by an electric current flowing through a channel of amorphous oxide semiconductor film 112 from a source electrode 113 to the drain electrode 114. The voltage can therefore be controlled by the voltage of a gate electrode 116 of the TFT. When a display medium of the display device is a capsule containing a fluid and particles encapsulated in an insulating film, the high-resistance films 121 and 122 can be eliminated.

A display apparatus can be assembled by coupling an output terminal, that is, a drain of the field-effect transistor to an electrode of a display device, such as an organic or inorganic electroluminescent (EL) device or a liquid crystal device.

A display apparatus including two-dimensionally arranged pixels is described below with reference to FIG. 11. The pixels include an EL device (organic EL device) and a field-effect transistor.

Figure 11:
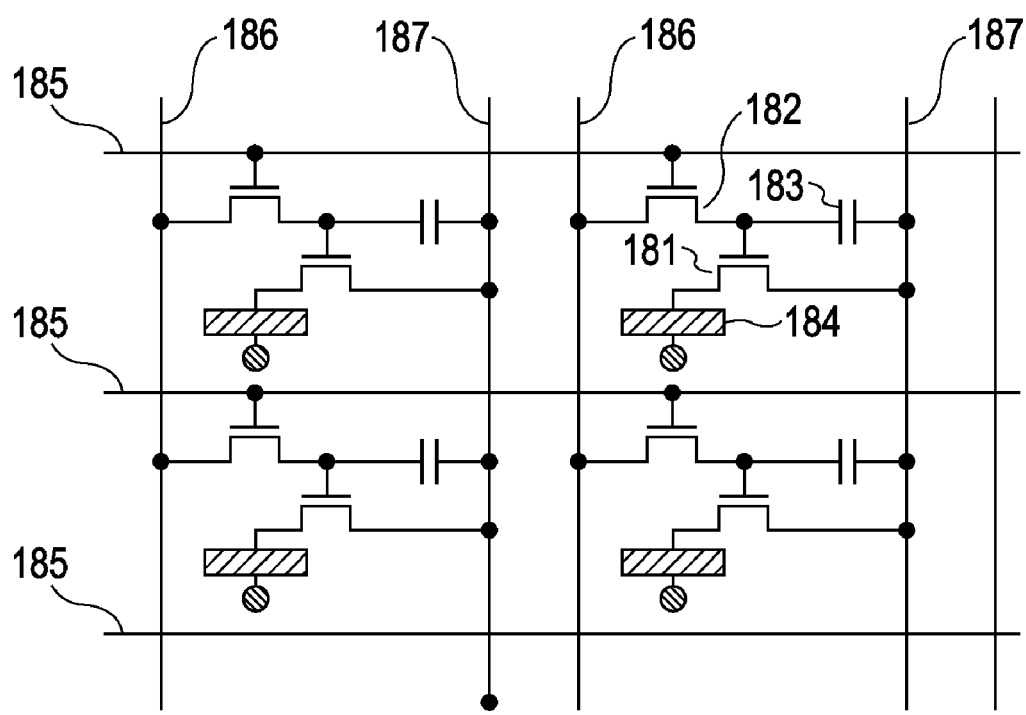
FIG. 11 is a schematic view of a display apparatus in which pixels including organic EL devices and thin film transistors are two-dimensionally arranged.

In FIG. 11, a first transistor 181 drives an organic EL layer 184. A second transistor 182 selects pixels. A capacitor 183 retains a selected state, stores electric charges between a common electrode line 187 and a source electrode of the second transistor 182, and retains the gating signal of the first transistor 181. Pixels are selected through a scanning electrode line 185 and a signal electrode line 186.

More specifically, a picture signal is sent from a driver circuit (not shown) to a gate electrode through a scanning electrode line 185 as a pulse signal. Simultaneously, a picture signal is sent from another driver circuit (not shown) to the second transistor 182 through the signal electrode line 186, also as a pulse signal. Thus, pixels are selected. This turns on the second transistor 182 and stores electric charges in the capacitor 183 disposed between the signal electrode line 186 and the source electrode of the second transistor 182. This maintains the gate voltage of the first transistor 181 at a desired voltage and turns on the first transistor 181. This state is held until the next signal is received. While the first transistor 181 is in an "ON" state, a voltage and an electric current are continuously supplied to the organic EL layer 184, thereby maintaining luminescence.

In the display apparatus illustrated in FIG. 11, one pixel includes two transistors and one capacitor. However, one pixel may include three or more transistors to improve the performance.

EXAMPLE 1

FIGS. 2A-2F illustrate a method for manufacturing a top-gate field-effect transistor. As illustrated in FIG. 2B, an electrode layer 17 is formed on a glass substrate 10 (Corning Inc., 1737) as illustrated in FIG. 2A, by sputtering. A source electrode 11 and a drain electrode 12 are later formed from the electrode layer 17. The electrode layer 17 is formed of indium tin oxide (ITO) and has a thickness of 50 nm.

Hydrogen ($H_2$) is then implanted into the ITO electrode by ion implantation at an implantation energy of 5 keV and a hydrogen ion dose of $1\times10^{16}$ (/cm$^2$). The hydrogen concentration under this ion implantation condition is estimated to be about $1\times10^{21}$ (/cm$^3$).

As illustrated in FIG. 2C, the electrode layer 17 is patterned by photolithography and etching to form the source electrode 11 and the drain electrode 12.

As illustrated in FIG. 2D, an amorphous In—Zn—Ga—O oxide semiconductor layer 13 having a thickness of 50 nm is formed on the source electrode 11, the drain electrode 12, and the glass substrate 10. The oxide semiconductor layer 13 is formed with a radio frequency (RF) sputtering apparatus at a substrate temperature of room temperature (25° C.). A target is a three-inch polycrystalline sintered compact having an $In_2O_3$.ZnO composition. The RF input power is 200 W. The oxide semiconductor layer 13 is formed in an atmosphere of Ar:$O_2$=95:5 at a total pressure of 0.5 Pa. As illustrated in FIGS. 2E and 2F, a gate insulating layer 14 and a gate electrode 15 are then formed.

The gate insulating layer 14 is formed from $SiO_2$ by sputtering and has a thickness of 150 nm. The gate insulating layer 14 is patterned by photolithography and lift-off.

The gate electrode 15 is formed from Au by electron-beam evaporation and has a thickness of 30 nm, and the gate electrode 15 is patterned by photolithography and lift-off.

The layered structure thus manufactured is then annealed in an electric furnace at 150° C. under atmospheric pressure for 20 minutes to cause hydrogen to diffuse in the oxide semiconductor layer 13.

A field-effect transistor thus produced has excellent hysteresis characteristics, uniformity, and excellent high-speed operability.

COMPARATIVE EXAMPLE

These comparative experiments will show that diffusion of hydrogen from a hydrogen-containing electrode to an oxide semiconductor layer reduces the parasitic resistance between the hydrogen-containing electrode and the oxide semiconductor layer.

An ITO electrode having a thickness of 125 nm is formed on a glass substrate (Corning Inc., 1737) by sputtering.

Hydrogen ($H_2$) is then implanted into the ITO electrode by ion implantation at an implantation energy of 5 keV and a hydrogen ion dose of $1\times10^{16}$ (/cm$^2$). The hydrogen concentration under this ion implantation condition is estimated to be about $1\times10^{21}$ (/cm$^3$).

An amorphous In—Zn—Ga—O oxide semiconductor layer having a thickness of 50 nm is then formed on the ITO electrode containing hydrogen ions. The oxide semiconductor layer is formed with an RF sputtering apparatus at a substrate temperature of room temperature (25° C.). A target is a three-inch polycrystalline sintered compact having an $In_2O_3$.ZnO composition. The RF input power is 200 W, and the oxide semiconductor layer is formed in an atmosphere of Ar:$O_2$=95:5 at a total pressure of 0.5 Pa.

The layered structure thus manufactured is then annealed in an electric furnace at 150° C. or 300° C. under atmospheric pressure for 20 minutes to cause hydrogen to diffuse in the oxide semiconductor layer.

An electrode having a thickness of 30 nm is formed on the oxide semiconductor layer by electron-beam evaporation using a mask having a diameter of 300 μm.

Figure 6:
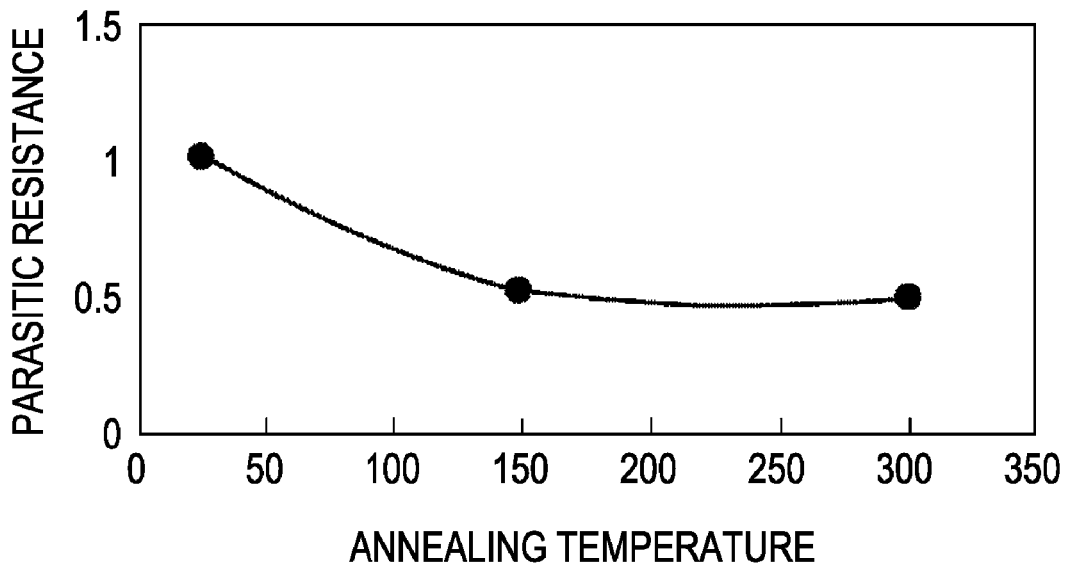
FIG. 6 is a graph illustrating the parasitic resistance of an In—Ga—Zn—O amorphous oxide film as a function of annealing temperature.
Figure 7:
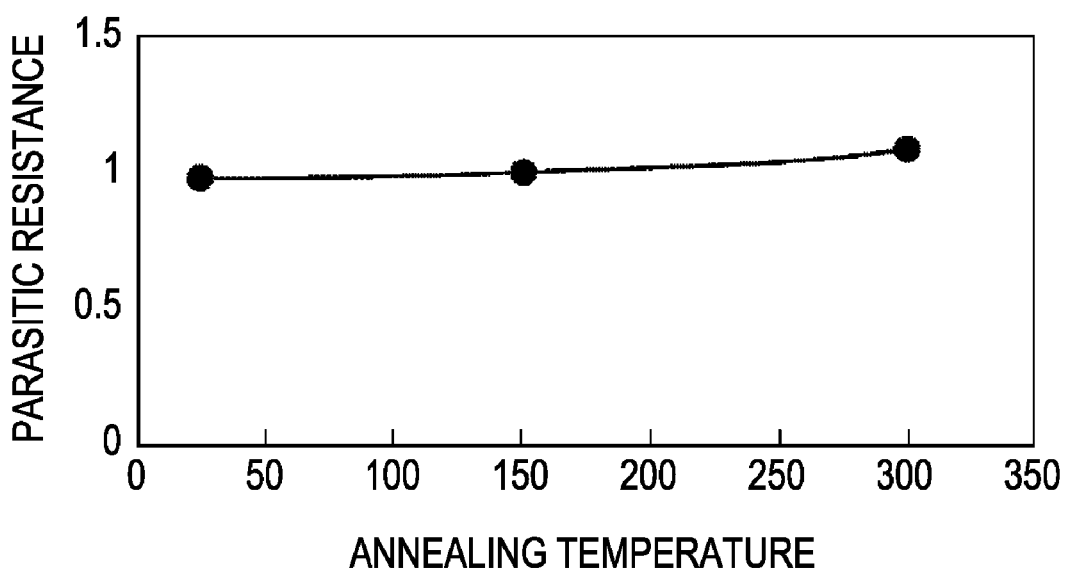
FIG. 7 is a graph illustrating the parasitic resistance of an In—Ga—Zn—O amorphous oxide film on a hydrogen-free substrate, as a function of annealing temperature.

The I-V characteristics and the electrical resistance of the transistor thus manufactured are determined to evaluate the parasitic resistance. FIG. 6 shows the parasitic resistance of the In—Ga—Zn—O amorphous oxide layer as a function of annealing temperature. As a comparative example, transistors including an oxide semiconductor layer in contact with an electrode free of hydrogen were produced. One of the transistors was placed at room temperature (25° C.). The other transistors were annealed at 150° C. or 300° C. The parasitic resistances of the transistors were then measured. FIG. 7 shows the results. The parasitic resistances in FIGS. 6 and 7 are normalized relative to the parasitic resistances at room temperature (25° C.). In the case of the hydrogen-containing electrodes, the parasitic resistance decreased with increasing annealing temperature. By contrast, in the case of the hydrogen-free electrodes, the parasitic resistance did not decrease with increasing annealing temperature.

Figure 8:
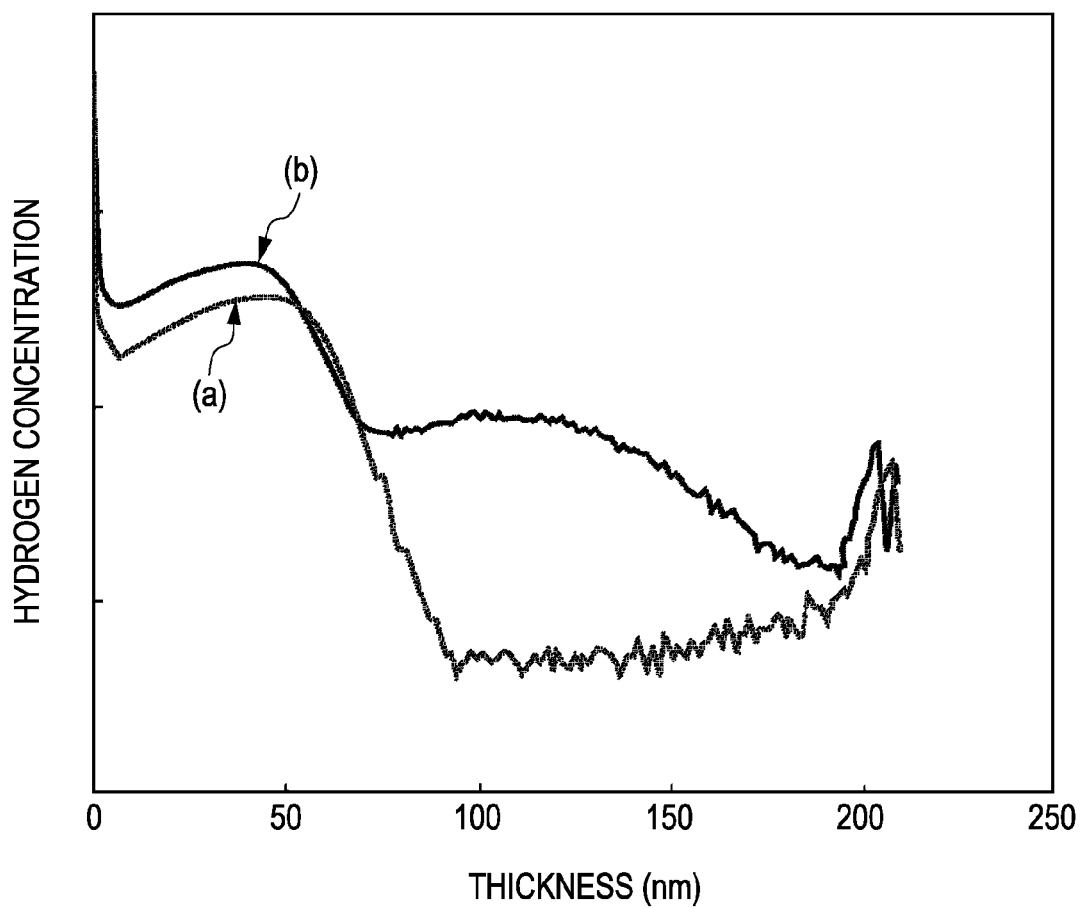
FIG. 8 is a graph illustrating SIMS measurements of an In—Ga—Zn—O amorphous oxide film and an electrode.

FIG. 8 shows the hydrogen concentration, as determined by SIMS, of a device including the hydrogen-free electrode (a) and a device including the hydrogen-containing electrode (b) (annealing temperature was 150° C.). The thickness (depth) in the range of 0 to 50 nm on the horizontal axis corresponds to the oxide semiconductor layer. The thickness (depth) of more than 50 nm corresponds to the electrode. FIG. 8 shows that the oxide semiconductor layer of (b) contains a larger amount of hydrogen than the oxide semiconductor layer of (a). This result indicates that annealing of the hydrogen-containing electrode at 150° C. allows hydrogen to diffuse in the oxide semiconductor layer.

EXAMPLE 2

Figure 4A:
FIGS. 4A to 4G are schematic views illustrating a method for manufacturing a field-effect transistor according to an embodiment of the present invention.
Figure 4B:
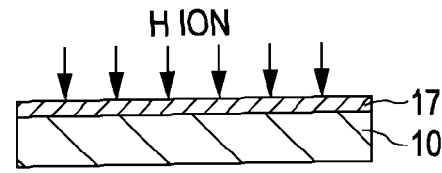

FIGS. 4A to 4G illustrate a method for manufacturing a top-gate field-effect transistor. As illustrated in FIG. 4B, an electrode layer 17 is formed by sputtering on a glass substrate 10 (Corning Inc., 1737) illustrated in FIG. 4A. A source electrode 11 and a drain electrode 12 are later formed from the electrode layer 17. The electrode layer 17 includes a Ti layer having a thickness of 5 nm formed on the glass substrate 10 and a Pt layer having a thickness of 50 nm formed on the Ti layer.

Pt is sputtered in an $H_2$ gas and an Ar gas at a flow ratio of about 3:100.

Figure 4C:
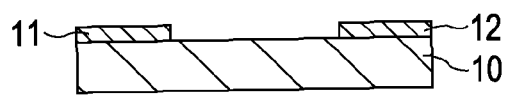

As illustrated in FIG. 4C, the electrode layer 17 is patterned by photolithography and etching to form the source electrode 11 and the drain electrode 12.

Figure 4D:
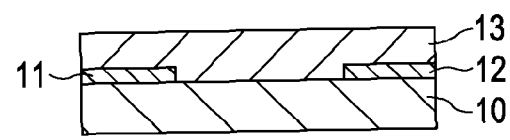

As illustrated in FIG. 4D, an amorphous In—Zn—Ga—O oxide semiconductor layer 13 having a thickness of 50 nm is formed on the source electrode 11, the drain electrode 12, and the glass substrate 10. The oxide semiconductor layer 13 is formed with an RF sputtering apparatus at a substrate temperature of room temperature (25° C.). A target is a three-inch polycrystalline sintered compact having an $In_2O_3.ZnO$ composition. The RF input power is 200 W, and the oxide semiconductor layer 13 is formed in an atmosphere of $Ar:O_2=95:5$ at a total pressure of 0.5 Pa.

Figure 4E:
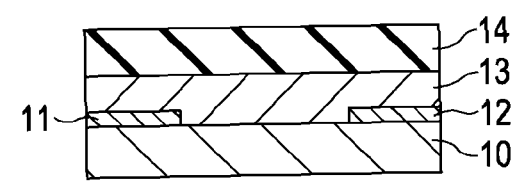
Figure 4F:
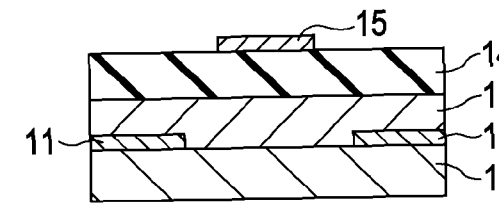

As illustrated in FIGS. 4E and 4F, a gate insulating layer 14 and a gate electrode 15 are then formed. The gate insulating layer 14 is formed from $SiO_2$ by sputtering and has a thickness of 150 nm, and the gate insulating layer 14 is patterned by photolithography and lift-off.

The gate electrode 15 is formed from Au by electron-beam evaporation and has a thickness of 30 nm. The gate electrode 15 is patterned by photolithography and lift-off.

Figure 4G:
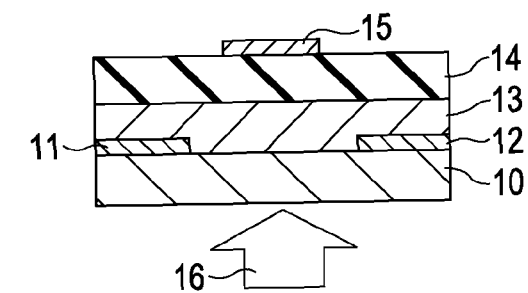

As illustrated in FIG. 4G, the back of the substrate is irradiated with a laser 16 to heat the source electrode 11 and the drain electrode 12, thereby causing hydrogen to diffuse in the oxide semiconductor layer 13.

The laser 16 is a XeCl excimer laser (wavelength: 308 nm) having an output of 500 mJ/pulse and a pulse width of 100 ns.

A KrF excimer laser (wavelength: 248 nm), an ArF excimer laser (wavelength: 193 nm), and a XeF excimer laser (wavelength: 353 nm) may be used in place of the XeCl excimer laser.

A field-effect transistor thus produced has excellent hysteresis characteristics, uniformity, and excellent high-speed operability.

EXAMPLE 3

Figure 5A:
FIGS. 5A to 5E are schematic views illustrating a method for manufacturing a field-effect transistor according to an embodiment of the present invention.
Figure 5B:
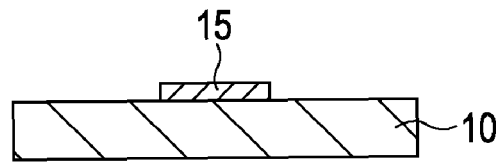

FIGS. 5A-5E illustrate a method for manufacturing a bottom-gate field-effect transistor. As illustrated in FIG. 5B, a gate electrode 15 is patterned on a glass substrate 10 (Corning Inc., 1737) as illustrated in FIG. 5A, by photolithography and etching. A Ti layer (5 nm) and a Pt layer (50 nm) are formed, as the gate electrode 15, on the glass substrate 10 in this order by sputtering.

Figure 5C:
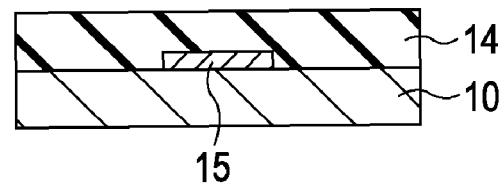

As illustrated in FIG. 5C, a gate insulating film 14 is patterned by photolithography and etching. The gate insulating film 14 is a $SiO_2$ film having a thickness of 150 nm formed by sputtering.

Figure 5D:
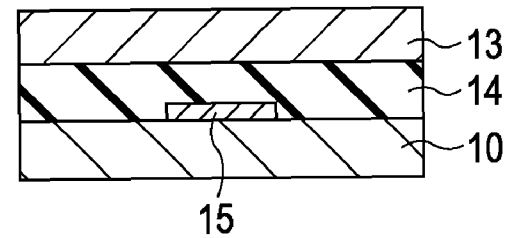

As illustrated in FIG. 5D, an oxide semiconductor layer 13 is patterned by photolithography and etching. The oxide semiconductor layer 13 is formed of an amorphous In—Zn—Ga—O oxide semiconducting material and has a thickness of 50 nm.

The oxide semiconductor layer 13 is formed with an RF sputtering apparatus at a substrate temperature of room temperature (25° C.). A target is a three-inch polycrystalline sintered compact having an $In_2O_3.ZnO$ composition. The RF input power is 200 W, and the oxide semiconductor layer 13 is formed in an atmosphere of $Ar:O_2=95:5$ at a total pressure of 0.5 Pa.

Figure 5E:
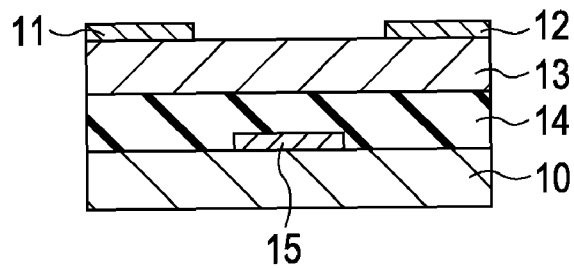

As illustrated in FIG. 5E, a source electrode 11 and a drain electrode 12 are then patterned by photolithography and etching. Each of the source electrode 11 and the drain electrode 12 includes a Ti layer (5 nm) and a Pt layer (50 nm). These electrodes are formed by sputtering. Sputtering is performed in an $H_2$ gas and an Ar gas at a flow ratio of about 3:100 to implant hydrogen into the source electrode 11 and the drain electrode 12.

The layered structure thus manufactured is then annealed in an electric furnace at 150° C. under atmospheric pressure for 20 minutes to cause hydrogen to diffuse in the oxide semiconductor layer 13.

A field-effect transistor thus produced has excellent hysteresis characteristics, uniformity, and excellent high-speed operability.

EXAMPLE 4

The present example describes a display apparatus including a top-gate TFT. The top-gate TFT is manufactured as in Example 1 or 2. The short sides of an ITO film forming a drain electrode are extended to 100 μm. Except for 90 μm of the extended portion, the TFT is covered with an insulating layer while the drain electrode is electrically connected to a source electrode and a gate electrode. The insulating layer is coated with polyimide and is subjected to a rubbing process.

At the same time, a second layered structure including an ITO film and a polyimide film formed on a plastic substrate is manufactured in the same way and is subjected to a rubbing process. The second layered structure is placed opposite the top-gate TFT at a distance of 5 μm. The space is filled with a nematic liquid crystal. A pair of polarizers are placed on the outer faces of the top-gate TFT and the second layered structure. When a voltage is applied to the source electrode of the top-gate TFT to change the voltage applied to the gate electrode, this voltage change alters the light transmittance of a 30 μm×90 μm portion of the ITO film extended from the drain electrode. The light transmittance can also continuously be changed with the voltage placed between the source electrode and the drain electrode at a gate voltage at which the top-gate TFT is in an ON state. A display apparatus including liquid crystal cells as display devices is thus manufactured, as illustrated in FIG. 9.

In the present example, the substrate on which the TFT is formed may be a white plastic substrate, electrodes of the TFT may be formed of gold, and the polyimide film and the polarizer may be eliminated. A space between the white plastic substrate and a transparent plastic substrate is filled with capsules containing particles and a fluid encapsulated in an insulating film. In a display apparatus having such a structure, a voltage between the extended drain electrode and the ITO film is controlled by the TFT and thereby the particles in the capsules move up or down. This movement can control the reflectance of the extended drain electrode on the transparent substrate side, thereby displaying an image.

In the present example, an organic electroluminescent (EL) device including a charge injection layer and a luminescent layer may be formed on a 30 μm×90 μm portion of the ITO film extended from the drain electrode. Thus, a display apparatus including the EL device can be manufactured.

EXAMPLE 5

A plurality of display devices according to Example 4 and TFTs are two-dimensionally arranged. For example, 7425× 1790 pixels each having a size of 30 μm×115 μm are arranged at intervals of 40 μm in a transverse direction and 120 μm in a longitudinal direction. The pixels include the display devices according to Example 4, such as liquid crystal cells or EL devices, and TFTs. 1790 gate lines pass through the gate electrodes of the 7425 TFTs in the longitudinal direction. 7425 signal lines pass through portions of the source electrodes of the 1790 TFTs extending by 5 µm off the amorphous oxide semiconductor film in the transverse direction. The gate lines are connected to a gate driver circuit. The signal lines are connected to a source driver circuit. In the case of a liquid crystal display device, a color filter having the same size as the liquid crystal display device may be appropriately placed on the liquid crystal display device to manufacture an A4-size active-matrix color image display apparatus having about 211 pixels per inch (ppi). In the color filter, red, green, and blue (RGB) pixels are repeated in a longitudinal direction.

Also in the case of an EL device, a gate electrode of a first TFT of two TFTs included in the EL device is connected to a gate line, and a source electrode of a second TFT is connected to a signal line. The emission wavelengths of RGB are repeated in a longitudinal direction of the EL device. Thus, an emissive color image display apparatus having the same resolution as the active-matrix color image display apparatus can be manufactured.

A driver circuit for driving an active-matrix may include the same TFT as the pixel TFT according to the present invention or an existing IC Chip.

A field-effect transistor according to the present invention can be used as a switching element in a liquid crystal display or an organic EL display. Furthermore, a field-effect transistor according to the present invention can be formed on a flexible material such as a plastic film at a low temperature. A field-effect transistor according to the present invention can therefore be widely used in flexible displays, IC cards, and ID tags.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Patent Application No. 2006-250902 filed Sep. 15, 2006, which is hereby incorporated by reference herein in its entirety.

What is claimed is:

1. A method for manufacturing a field-effect transistor, comprising the steps of:
   forming a source electrode and a drain electrode each containing hydrogen or deuterium;
   forming an oxide semiconductor layer;
   causing hydrogen or deuterium to diffuse from the source electrode and the drain electrode to the oxide semiconductor layer.

2. The method for manufacturing a field-effect transistor according to claim 1, wherein the step of forming a source electrode and a drain electrode each containing hydrogen or deuterium is selected from a step of forming the source electrode and the drain electrode in an atmosphere containing an $H_2$ gas, a step of forming the source electrode and the drain electrode in an atmosphere containing an $H_2O$ gas, a step of treating the source electrode and the drain electrode with hydrogen plasma after the formation of the source electrode and the drain electrode, and a step of bombarding the source electrode and the drain electrode with accelerated hydrogen ions after the formation of the source electrode and the drain electrode.

3. The method for manufacturing a field-effect transistor according to claim 1, wherein the concentration of hydrogen ions diffused in the step of causing hydrogen or deuterium to diffuse from the source electrode and the drain electrode to the oxide semiconductor layer is in the range of 0.1 to 10 atomic percent in regions in the oxide semiconductor layer in contact with the source electrode and the drain electrode.

4. The method for manufacturing a field-effect transistor according to claim 1, wherein the concentration of hydrogen ions diffused in the step of causing hydrogen or deuterium to diffuse from the source electrode and the drain electrode to the oxide semiconductor layer is in the range of 0.5 to 5 atomic percent in regions in the oxide semiconductor layer in contact with the source electrode and the drain electrode.

5. The method for manufacturing a field-effect transistor according to claim 1, wherein the step of causing hydrogen or deuterium to diffuse from the source electrode and the drain electrode to the oxide semiconductor layer is an annealing step.

6. The method for manufacturing a field-effect transistor according to claim 1, wherein the oxide semiconductor layer is formed of an amorphous oxide material containing In, Ga, and Zn.

7. A field-effect transistor comprising:
   an oxide semiconductor layer having a channel region between a source electrode and a drain electrode;
   a gate insulator; and
   a gate electrode,
   wherein the gate insulator is disposed between the gate electrode and the oxide semiconductor layer, and
   wherein a concentration of hydrogen or deuterium in regions in the oxide semiconductor layer in contact with the source electrode and the drain electrode is higher than a concentration of hydrogen or deuterium in the channel region.

8. The field-effect transistor according to claim 7, wherein the hydrogen-ion concentration of the regions in the oxide semiconductor layer in contact with the source electrode and the drain electrode is in the range of 0.1 to 10 atomic percent.

9. The field-effect transistor according to claim 7, wherein the hydrogen-ion concentration of the regions in the oxide semiconductor layer in contact with the source electrode and the drain electrode is in the range of 0.5 to 5 atomic percent.

10. The field-effect transistor according to claim 7, wherein the oxide semiconductor layer is formed of an amorphous oxide material containing In, Ga, and Zn.

11. A display apparatus comprising display devices, and having a field-effect transistor according to claim 7, wherein electrodes of each of the display devices are electrically connected to the source electrode or the drain electrode of the field-effect transistor.

12. The display apparatus according to claim 11, wherein the display devices are electroluminescent devices.

13. The display apparatus according to claim 11, wherein the display devices are liquid crystal cells.

14. The display apparatus according to claim 11, wherein a plurality of display devices and a plurality of field-effect transistors are two-dimensionally arranged on a substrate.

* * * * *